United States Patent [19]

Woith et al.

[11] Patent Number: 5,224,865

[45] Date of Patent: Jul. 6, 1993

[54] SLIDING WEDGE ELECTRICAL CONNECTOR

[75] Inventors: Blake F. Woith, Orange; Robert E. Daugherty, Irvine, both of Calif.

[73] Assignee: Hughes Aircraft Company, Los Angeles, Calif.

[21] Appl. No.: 840,225

[22] Filed: Feb. 24, 1992

[51] Int. Cl.⁵ .................................. H01R 9/09
[52] U.S. Cl. ........................ 439/67; 439/77; 439/493
[58] Field of Search ............ 439/65, 67, 74, 77, 439/493, 499

[56] References Cited

U.S. PATENT DOCUMENTS

| | | | |
|---|---|---|---|
| 3,522,484 | 8/1970 | Clements | 439/493 |
| 4,695,258 | 9/1987 | Hanson et al. | 439/67 |
| 4,768,971 | 9/1988 | Simpson | 439/67 |
| 4,824,379 | 4/1989 | Roberts et al. | 439/77 |

Primary Examiner—Paula A. Bradley
Attorney, Agent, or Firm—Elizabeth E. Leitereg; Terje Gudmestad; Wanda K. Denson-Low

[57] ABSTRACT

An electrical connector is provided for connecting a flexible circuit (45) to a printed circuit board (14). The connector includes a housing (10) within which is a slide (26) beneath which is a pressure bar (34) and a pad (42). The housing (10) is attachable to a circuit board (14) and a flexible circuit end can be inserted into the housing (10) beneath the pad (42). The slide (26) is moved longitudinally, causing cam surfaces (29, 30, 31, 32, 38, 39) on the slide (26) and pressure bar (34) to force the pressure bar (34) against the flexible circuit (45). This causes contacts (47) on the flexible circuit (45) to firmly engage contacts (46) on the circuit board (14) to effect an electrical connection.

11 Claims, 2 Drawing Sheets

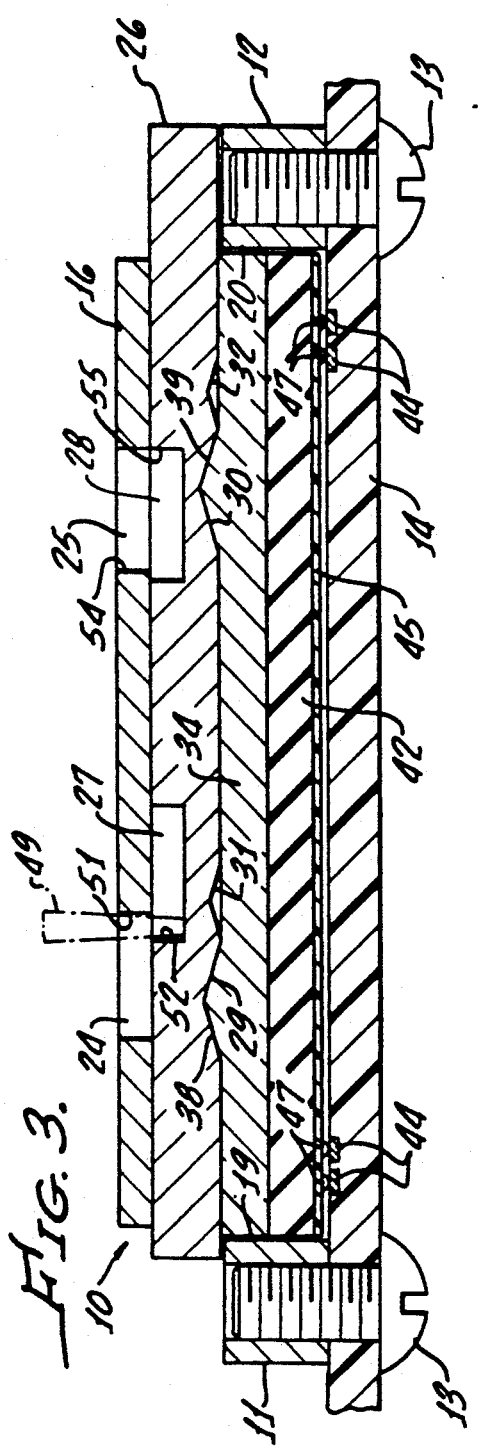
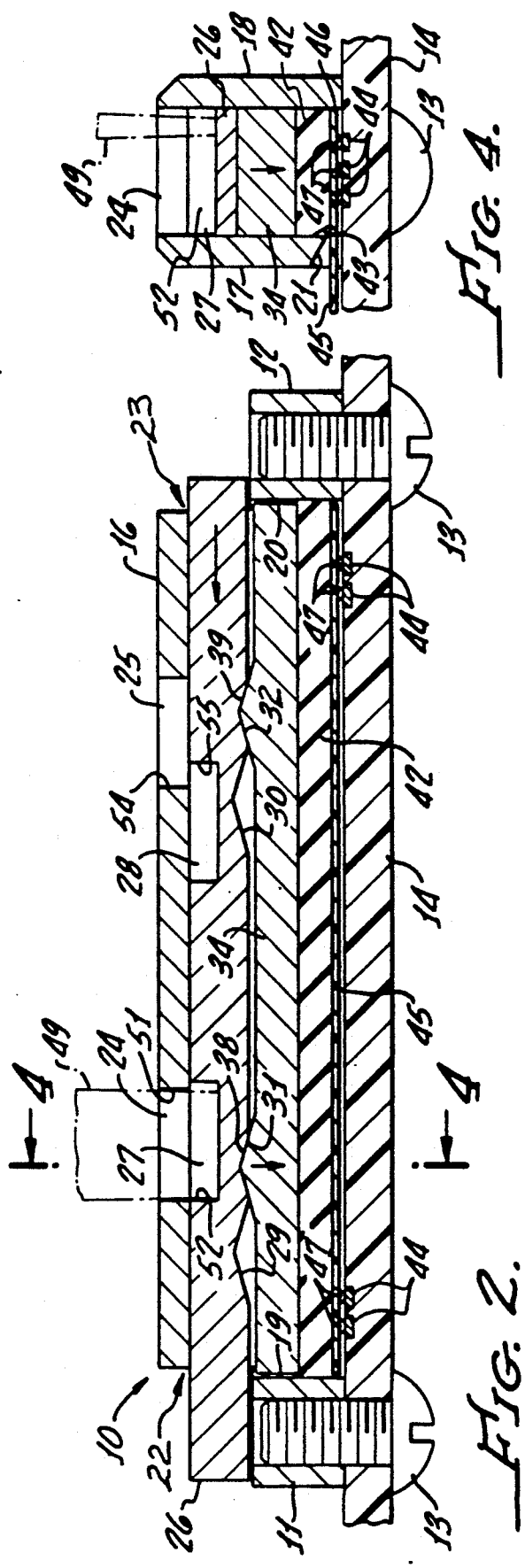

SLIDING WEDGE ELECTRICAL CONNECTOR

BACKGROUND OF THE INVENTION

1. Field of the Invention

This invention pertains to electrical connectors, in particular to connectors for interconnecting flexible circuits and printed circuit boards.

2. Description of Related Art

Electrical connections frequently are made between flexible circuits and printed circuit boards. The flexible circuit may consist of a flat flexible substrate on which are electrical conductors which at an end portion of the circuit terminate in raised gold plated protuberances which form electrical contacts. These gold dots must be pressed firmly against contact pads on the printed circuit board in order to complete an electrical connection.

Conventional connectors for connecting flex circuits to printed circuit boards are relatively bulky and complicated. Although a gold dot flex circuit is inherently small in size, the advantage of this may be lost when utilizing bulky conventional connectors. Space saving is a matter of increasing importance in such electrical circuits. With the size and complexity of conventional connectors is the added penalty of relatively high cost manufacture and greater weight than is desirable.

SUMMARY OF THE INVENTION

The present invention overcomes the difficulties of the prior art, providing an electrical connector for flex circuits which is uncomplicated, small in size and light in weight. The connector of this invention is economically manufactured and thoroughly reliable in its operation. Very few parts are included in the connector.

The connector of this invention includes a housing within which is a slide confined to linear movement. Beneath the slide is a rigid pressure bar which is confined to vertical movement, that is, movement perpendicular to the path of movement of the slide. A resilient pad beneath the pressure bar also is confined to vertical movement.

The housing includes means for attachment to a printed circuit board above an area where there are contact pads. An opening in one wall of the housing allows a flex circuit to be inserted and guides it to a position of registry over the contact pads on the printed circuit board. The slide then is moved in one direction. The slide and pressure bar are provided with interengaged cam surfaces which force the pressure bar downwardly when the slide is so moved so that the resilient pad biases the flex circuit toward the printed circuit board. This causes the gold dot contacts on the flex circuit to make a good electrical connection with the contact pads on the printed circuit board. The interengaged cam surfaces also include a decent arrangement which retains the slide in the locked position. The flex circuit may be released by moving the slide in the opposite direction where it again will be retained by a decent. In the second position the pressure bar, and hence the resilient pad, may move upwardly away from the flex circuit so that the flex circuit is free to be removed from the connector. Movement of the slide in either direction may be accomplished by a convenient screwdriver slot arrangement or by other means. The result is an effective and easily operated electrical connector which nevertheless is small in size, has few moving parts and is of simple construction.

BRIEF DESCRIPTION OF THE DRAWINGS

FIG. 2 is an enlarged longitudinal sectional view, taken along line 2—2 of FIG. 1 with the connector in its closed position;

FIG. 3 is a view similar to FIG. 2, but with the connector in the open position;

FIG. 4 is a transverse sectional view taken along line 4—4 of FIG. 2; and

DESCRIPTION OF THE PREFERRED EMBODIMENTS

Figure 1:
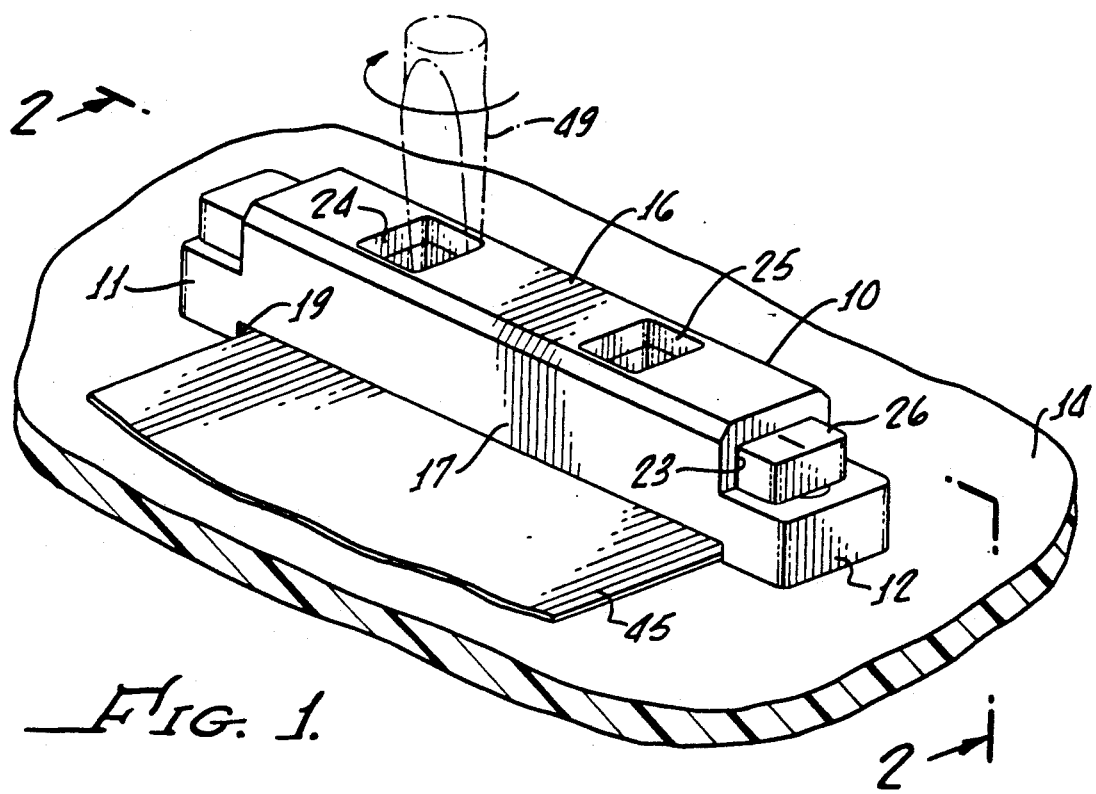
FIG. 1 is a perspective view of the connector of this invention associated with a circuit board and a flexible connector.
Figure 5:
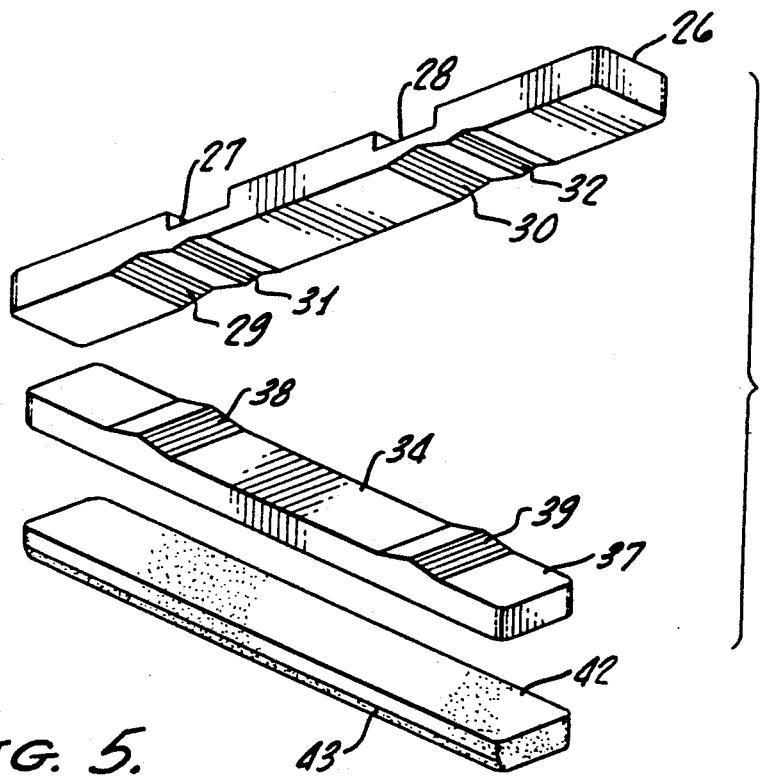
FIG. 5 is an exploded perspective view of internal components of the connector.

The connector of this invention includes an elongated housing 10 which may be of stainless steel and includes projecting opposite end parts 11 and 12, each with a tapped opening receiving a screw 13 which secures the housing to a flat printed circuit board 14. The housing 10 is hollow, with an open bottom adjacent the circuit board 14. The housing includes a top wall 16, which is parallel to the printed circuit board 14, front and back walls 17 and 18, respectively, and end walls 19 and 20. The bottom edges of the backwall 18 and the end walls 19 and 20 are in the same plane and engage the upper surface of the printed circuit board 14. The front wall 17, however, is shorter than the others, having a bottom edge 21 which is spaced a short distance above the printed circuit board. The bottom edge 21 of the front wall 17 is beveled, such as at an angle of 30 degrees to the plane of the printed circuit board 14, being inclined upwardly from the inside surface to the outside surface of the wall 17.

The housing 10 also includes opposite rectangular openings 22 and 23 through its ends above and inwardly of the end extensions 11 and 12. There are additional spaced generally rectangular openings 24 and 25 through the top wall 16 of the housing 10.

An elongated rigid slide 26, rectangular in cross-section, is received within the housing 10 beneath the upper wall 16 of the housing. The ends of the slide 26 project through the openings 22 and 23 beyond the ends of the upper wall 16.

The slide 26 fits closely between the front and back walls 17 and 18, and within the openings 22 and 23, so that the slide is allowed movement only in a rectilinear path relative to the housing 10. This path of movement is parallel to the bottom edges of the end walls 19 and 20 and the back wall 18, thus being parallel to the printed circuit board 14. The ends of the slide 26 extend over the end walls 19 and 20, and the housing extensions 11 and 12, which can support the slide vertically.

In the upper surface of the slide 26 are two spaced generally rectangular recesses 27 and 28 which do not extend through the slide. On the undersurface of the slide 26 are two recesses in the form of spaced relatively large V-shaped notches 29 and 30 which are transverse to the longitudinal axis of the slide. The walls of these notches taper at a shallow angle relative to the longitudinal axis of the slide, such as at an angle of 15 degrees. Additional recesses defined by V-shaped notches 31 and 32 also extend transversely of the undersurface of the slide 26. The notches 31 and 32 are more shallow than and not as wide as the notches 29 and 30. The walls of the shallow notches 31 and 32 are at the same angle as are the walls of the notches 29 and 30. Both the notches 31 and 32 are immediately adjacent the deeper notches 29 and 30, being on the right-hand side of the larger notches, as the device is shown.

An elongated pressure bar 34 is received within the housing beneath the slide 26. The opposite ends of the pressure bar 34 are adjacent the end walls 19 and 20 of the housing, and its side edges are next to the front and back walls 17 and 18. Consequently, the pressure bar 34 is restrained against substantial movement laterally of the housing, but the pressure bar can move vertically, as with an arrow in FIGS. 2 and 4 illustrated. The upper and lower surfaces of the pressure bar 34 are flat except for spaced transverse V-shaped ridges 38 and 39 on the upper surface 37. The ridges 38 and 39 are substantially complementary to the notches 29 and 30 in the slide 26 and, as shown in FIG. 3, are received within those notches.

Beneath the pressure bar 34 is a resilient pad 42 which is confined by the front and back walls 17 and 18 and the end walls 19 and 20 of the housing. Like the pressure bar, the pad 42 can move only vertically. The edge of the pad 42 adjacent the front wall 17 of the housing is provided with a bevel 43 that inclines upwardly from the bottom surface toward the side edge of the pad. The pad 42 may be made of silicone rubber having 40 to 60 shore hardness.

The printed circuit board 14 includes conventional conductors which terminate at contact pads 44 beneath the housing 10.

The end portion of a flexible circuit 45 is slid into the housing 10 through the space below the bottom edge 21 of the front wall 17. The bevel on the edge 17, as well as the bevel 43 of the pad 42, facilitates the entry of the flexible circuit 45 into the housing beneath the pad 42. The distance between the end walls 19 and 20 of the housing is selected so that it corresponds to the width of the flexible circuit 45. The end portion of the flexible circuit 45 is advanced into the housing until its end edge 46 abuts the rear wall 18 of the housing.

On the bottom surface of the flexible circuit 45 are raised features which provide protruding contacts 47. When the flexible circuit is inserted into the housing in the manner described, the contacts 47 become positioned immediately above and in registry with the contact pads 44 on the printed circuit board 14.

When the slide 26 is in the position shown in FIG. 3, which is the released position of the connector, a narrow portion of the recess 27 is located beneath the opening 24 in the top wall 16 of the housing 10. Most of the other recess 28 is exposed at the opening 25. In order to move the slide 26 longitudinally of the housing 10 and the pressure bar 34 to the closed position of FIG. 2, a screwdriver blade 49 is inserted into the slot formed between the right-hand edge 51 of the opening 24 and the left-hand edge 52 of the recess 27, as the device is illustrated, and the blade is twisted. As the slide 26 is then caused to move longitudinally, the V-shaped ridges 38 and 39 on the pressure bar are cammed out of the notches 29 and 30 by virtue of the inclined walls of the ridges and the notches. The slide 26 then reaches a position where the ridges 38 and 39 enter the more shallow notches 31 and 32. As this occurs, the pressure bar 34 is moved downwardly, i.e., in a direction perpendicular to the path of movement of the slide, because the notches 31 and 32 are more shallow than the notches 29 and 30. This forces the pad 42 downwardly against the upper surface of the end portion of the flexible circuit 45. As a result, the pad 42 is compressed and the contacts 47 of the flexible circuit are pressed firmly against the contact pads 44 of the printed circuit board 14. An electrical connection is accomplished.

The connector 10 is released by reverse movement of the slide 26 to the position of FIG. 3. For opening the connector, the screwdriver blade 49 is inserted between the left-hand edge 54 of the opening 25 and the right-hand edge 55 of the recess 28 and twisted in the slot. This moves the slide longitudinally to a position where the ridges 38 and 39 enter the notches 29 and 30. This allows the slide 26 and pad 42 to move upwardly so that the pad no longer is compressed against the end of the flexible circuit 45. The flexible circuit then can be removed from the housing 10. The connector may be designed so that the slide 26 is movable by means of a raised tab, by direct finger pressure or by other suitable means.

In either position, the ridges 38 and 39 in the notches 29 and 30 or the notches 31 and 32 provide a decent effect to retain the slide 26 until it is moved. Thus the connector will remain in the closed position and will be unaffected when subjected to vibrational forces.

Indicia may be provided to show whether the connector is in the open or the closed position. This may be an "O" marked on the bottom of the recess 28, which is visible when the slide is in its released position, and a letter "C" on the bottom of the recess 27, which can be seen when the slide is in its closed position.

What is claimed is:

1. An electrical connector device comprising:
a slide,
a structure including means for confining said slide to linear movement along a predetermined path, and
a pressure-exerting element,
wherein said structure comprises
   means for attachment to a first member having contact means thereon,
   means for confining said pressure-exerting element to limited movement in a direction perpendicular to said path, and
   means for receiving in a predetermined location adjacent said pressure-exerting element a second member having contact means thereon which are mateable with said contact means on said first member, and wherein
said slide and said pressure-exerting element include cooperable means for forcing said pressure-exerting element way from said path upon movement of said slide in one direction relative to said structure, thereby forcing such a second member against such a first member so that said contact means of said first and second members make an electrical connection, and
said cooperable means for allowing said pressure-exerting element to move toward said path upon movement of said slide in the opposite direction relative to said structure, thereby releasing said second member from said first member so that said second member can be removed from and replaced in said predetermined location,
said cooperable means comprising
   a rigid member on said pressure-exerting element adjacent said slide, and
   a recess on said slide adjacent said pressure-exerting element for receiving said rigid member upon said movement of said slide in the opposite direction.

2. A device as recited in claim 1 which said pressure-exerting element includes a resilient member adjacent said predetermined location, whereby said resilient member is engageable with said second member.

3. A device as recited in claim 1 in which said rigid member and said recess of said cooperable means include interengageable cam surfaces.

4. A device as recited in claim 3 in which for said cam surfaces said rigid member includes at least one ridge transverse to said path and said slide includes a duality of spaced recesses transverse to said path, one of said recesses being more shallow than the other of said recesses, said ridge being receivable in said more shallow recess upon said movement of said slide in said one direction, said ridge being receivable in the other of said recesses upon said movement of said slide in the opposite direction.

5. A device as recited in claim 4 in which said ridges and said recesses are V-shaped.

6. An electrical connector device comprising
a housing,
    said housing including means for attachment to a printed circuit board,
a slide received in said housing and movable relative thereto along a predetermined linear path between a first position and a second position,
a pressure bar in said housing, one side of said pressure bar being adjacent said slide,
    said pressure bar being confined by said housing so as to be movable relative thereto only in a direction perpendicular to said path,
a resilient pad on the side of said pressure bar remote from said slide,
    said pad being confined by said housing so as to be free to move relative to said housing only in a direction perpendicular to said path,
    said housing having opening means adapted to receive a circuit-carrying member at a location adjacent said pad on the side of said pad remote from said pressure bar,
    said slide and said pressure bar including interengageable cam surfaces which in said first position of said slide causes said pressure bar and said pad to move away from said path to force said circuit-carrying member against a printed circuit board attached to said housing for making an electrical connection between said circuit-carrying member and said circuit board, and in said second position of said slide allows said pressure bar to assume a position closer to said path for releasing such a circuit-carrying member.

7. An electrical connector device comprising
a housing having a top wall, opposite end walls, opposite front and back walls and an open bottom,
    said end walls and said back wall having bottom edges in a common plane,
    said front wall having a bottom edge above said plane,
    said housing including means for attachment to a planar printed circuit board with said bottom edges of said end and back walls in engagement therewith,
    whereby there is access to the interior of said housing beneath said bottom edge of said front wall,
a slide movable in said housing parallel to said plane,
a pressure bar beneath said slide,
a resilient pad beneath said pressure bar,
    said pressure bar and said pad being confined by said front, back and end walls to movement perpendicular to said plane,
    said pressure bar and said slide having cooperable means for forcing said pressure bar downwardly upon movement of said slide in one direction for pressing a flexible circuit received in said housing beneath said resilient pad against such a planar circuit board,
    said cooperable means allowing said pressure bar to move upwardly upon movement of said slide in an opposite direction for releasing such a flexible circuit.

8. A device as recited in claim 7 in which said slide is positioned beneath said top wall, said top wall having a duality of spaced openings therethrough, said slide including a duality of spaced recesses in said upper surface thereof, said openings in said top wall and said recesses being positioned such that in said first position of said slide a narrow portion of one of said recesses is in registry with an edge portion of one of said openings in said top wall, and when said slide is in said second position a narrow portion of the other of said recesses is in registry with an edge portion of the other of said recesses, whereby a blade may be inserted into said edge portions and into said narrow portions for moving said slide between said first and second positions upon rotation of said blade.

9. A device as recited in claim 8 in which when a narrow portion of one of said recesses is so positioned in registry with an edge portion of one of said openings in said top wall, a greater portion of the other of said recesses is in registry with the other of said openings in said top wall, and including indicia on the surfaces of said recesses indicating whether said connector is closed by movement of said pressure bar downwardly or is open by allowing said pressure bar to move upwardly, when said greater portions of said recesses are so in registry with said openings in said top wall.

10. A device as recited in claim 7 in which said bottom edge of said front wall is inclined upwardly from the inside surface to the outside surface of said front wall for facilitating entry of a flexible circuit into said housing.

11. A device as recited in claim 7 in which said housing includes openings in said end walls, said slide extending through said openings in said end walls.

* * * * *